(12) United States Patent
Murata et al.

(10) Patent No.: US 7,918,122 B2
(45) Date of Patent: Apr. 5, 2011

(54) CONTAINER TRANSPORT SYSTEM AND MEASUREMENT CONTAINER

(75) Inventors: Masanao Murata, Ise (JP); Susumu Maetaki, Ise (JP)

(73) Assignee: Muratec Automation Co., Ltd., Kyoto (JP)

( * ) Notice: Subject to any disclaimer, the term of this patent is extended or adjusted under 35 U.S.C. 154(b) by 306 days.

(21) Appl. No.: 11/962,719

(22) Filed: Dec. 21, 2007

(65) Prior Publication Data

US 2008/0156069 A1 Jul. 3, 2008

(30) Foreign Application Priority Data

Dec. 22, 2006 (JP) ................................. 2006-345409

(51) Int. Cl.
*G01F 1/00* (2006.01)
*G01F 1/34* (2006.01)
(52) U.S. Cl. ......... 73/1.16; 73/1.25; 73/40.5 R; 73/49.1; 73/49.5
(58) Field of Classification Search .................. 73/1.16, 73/1.25, 1.26, 272 R, 40, 405 R, 49.1, 49.5
See application file for complete search history.

(56) References Cited

U.S. PATENT DOCUMENTS

| | | | | | |
|---|---|---|---|---|---|
| 5,059,079 | A | * | 10/1991 | Foulke et al. | 414/275 |
| 5,827,118 | A | * | 10/1998 | Johnson et al. | 454/187 |
| 5,833,726 | A | * | 11/1998 | Kinkead et al. | 55/356 |
| 6,079,927 | A | * | 6/2000 | Muka | 414/217 |
| 6,267,158 | B1 | * | 7/2001 | Saga | 141/94 |
| 6,272,919 | B1 | * | 8/2001 | Huiberts | 73/204.18 |
| 6,304,051 | B1 | * | 10/2001 | Sagues et al. | 318/568.11 |
| 6,336,546 | B1 | * | 1/2002 | Lorenz | 198/346.2 |
| 6,364,922 | B1 | * | 4/2002 | Tanaka et al. | 55/385.1 |
| 6,460,550 | B2 | * | 10/2002 | Nguyen | 134/104.1 |
| 6,540,466 | B2 | * | 4/2003 | Bachrach | 414/217 |
| 6,558,101 | B2 | * | 5/2003 | Inui | 414/267 |
| 6,582,182 | B2 | * | 6/2003 | Whalen | 414/276 |
| 6,594,546 | B2 | * | 7/2003 | Elger | 700/225 |
| 6,623,231 | B2 | * | 9/2003 | Elger | 414/331.01 |
| 6,637,998 | B2 | * | 10/2003 | Langan et al. | 414/217 |
| 6,643,558 | B2 | * | 11/2003 | Huber et al. | 700/112 |
| 6,670,568 | B2 | * | 12/2003 | Goetzke | 209/567 |
| 6,687,643 | B1 | * | 2/2004 | Cason, Jr. | 702/137 |
| 6,770,109 | B2 | * | 8/2004 | Tanaka et al. | 55/385.6 |
| 6,809,510 | B2 | * | 10/2004 | Goetzke | 324/158.1 |
| 6,821,082 | B2 | * | 11/2004 | McGowan | 414/805 |
| 6,822,575 | B2 | * | 11/2004 | Chen et al. | 340/606 |
| 6,876,191 | B2 | * | 4/2005 | de Ridder et al. | 324/158.1 |
| 2001/0007085 | A1 | * | 7/2001 | Sugikawa | 700/121 |
| 2002/0044856 | A1 | * | 4/2002 | Foulke et al. | 414/225.01 |

(Continued)

FOREIGN PATENT DOCUMENTS

JP  08203993 A  *  8/1996

(Continued)

*Primary Examiner* — David A. Rogers
(74) *Attorney, Agent, or Firm* — Young & Thompson (57) ABSTRACT

A stocker 1 includes a storage FOUP 20, plural purge units 50, a measurement FOUP 30 and a stacker crane 60. The storage FOUP 20 stores a semiconductor wafer inside. The measurement FOUP 30 includes a flow meter inside. The purge unit 50 includes a purge shelf 51 having plural purge tables 54 for placing the storage FOUP 20, and a nitrogen gas is supplied into the storage FOUP 20 placed on the purge table 54. The stacker crane 60 transports the storage container 20 onto the purge table 54, and the measurement FOUP 30 is transported between the plural purge tables 54.

11 Claims, 7 Drawing Sheets

U.S. PATENT DOCUMENTS

| | | | |
|---|---|---|---|
| 2002/0119036 A1* | 8/2002 | Huber et al. | 414/626 |
| 2003/0048202 A1* | 3/2003 | Francois | 340/945 |
| 2003/0082031 A1* | 5/2003 | Vatel et al. | 414/222.01 |
| 2003/0132135 A1* | 7/2003 | Natale et al. | 206/710 |
| 2004/0047714 A1* | 3/2004 | Poli et al. | 414/281 |
| 2004/0191032 A1* | 9/2004 | Foulke et al. | 414/280 |
| 2006/0288664 A1* | 12/2006 | Okabe et al. | 53/510 |
| 2008/0149528 A1* | 6/2008 | Sumi et al. | 206/710 |
| 2008/0260498 A1* | 10/2008 | Nagata et al. | 414/217 |
| 2009/0169342 A1* | 7/2009 | Yoshimura et al. | 414/217 |
| 2009/0272461 A1* | 11/2009 | Alvarez et al. | 141/64 |

FOREIGN PATENT DOCUMENTS

JP 09153533 A * 6/1997

* cited by examiner

CONTAINER TRANSPORT SYSTEM AND MEASUREMENT CONTAINER

BACKGROUND OF THE INVENTION

1. Field of the Invention

The present invention relates to a container transport system and a measurement container for replacing an inside of a container used for a clean room with a gas atmosphere and transporting the container.

2. Description of Related Art

For example, a semiconductor element is manufactured in a clean room whose inside atmosphere is cleaned. At the time of transporting a semiconductor substrate for forming the element between processes, a cassette in which the semiconductor substrate is stored is stored in a transportable sealed container in order to prevent dust from attaching to the semiconductor substrate. The inside atmosphere of the sealed container is replaced with an inert gas such as a nitrogen gas in order to prevent the growth of an oxide film caused due to natural oxidation of the semiconductor substrate.

As described above, the cassette is put into the sealed container filled with the nitrogen gas, and the sealed container is transported and stored. However, the nitrogen gas concentration in the sealed container sometimes becomes equal to or smaller than a prescribed value during waiting for the transport and during storage. In this case, the sealed container with the reduced nitrogen gas concentration is transported to a gas supplying device provided in the clean room to be purged again. Then, the sealed container is returned to the original place.

In Patent Reference-1, as a gas supplying system of this kind, there is proposed a system including a transportable sealed container for storing a semiconductor wafer and a gas supplying device for supplying/discharging the gas. Two gas passage pipes for making inside and outside communicate with each other are formed in the transportable sealed container. The gas supplying device includes a gas supplying passage airtightly communicating with the one gas passage pipe and a gas exhaust passage airtightly communicating with the other gas passage pipe. The gas supplying passage communicates with a gas supplying source for supplying the gas. The gas exhaust passage communicates with a processing device for discharging the gas. In this gas supplying system, the gas is supplied to the transportable sealed container from the gas supplying source via the gas supplying passage and the gas passage pipe. In addition, when the sealed container is filled with the nitrogen gas and the pressure in the sealed container becomes equal to or larger than a predetermined pressure, the gas is discharged to the processing device via the gas exhaust pipe and the gas exhaust passage.

Recently, it becomes general that the plural gas supplying devices of this kind are provided and the flow amount of gas supplied from the gas supplying source is controlled in each of the plural gas supplying devices.

Patent Reference-1: Japanese Patent Application Laid-open under No. 8-203993 (FIG. 1)

In the gas supplying device, the desired flow amount of gas cannot be sometimes supplied due to malfunction of a control circuit in the device and clogging of the gas supplying passage. Therefore, there is proposed a measurement of the gas flow amount by arranging a flow meter in the gas supplying passage of each gas supplying device in order to confirm whether or not the gas flow amount is appropriately supplied.

However, if the flow meter is arranged in each of the gas supplying passage of the gas supplying device, the plural flow meters become necessary. Thus, the cost becomes high. In addition, a space for arranging the flow meter becomes necessary in the gas supplying device.

SUMMARY OF THE INVENTION

The present invention has been achieved in order to solve the above problems. It is an object of this invention to provide a transport system of a container and a measurement container, capable of reducing a cost and saving a space.

According to one aspect of the present inventions there is provided a container transport system including: a storage container which includes a housing forming a space for storing a substrate and an opening, formed in the housing, for making a gas flow into the space; plural purge units each of which includes a purge table on which the storage container is placed and a gas inlet for making a gas flow for purge into the space from the opening by communicating with the opening in such a case that the storage container is placed on the purge table; a measurement container which includes a gas passage communicating with the gas inlet in a case of being placed on the purge table and a flow amount measurement unit which measures a flow amount of gas flowing in from the gas inlet through the gas passage; and a transport unit which transports the storage container to the purge table and which transports the measurement container between the plural purge tables.

In accordance with the container transport system, the flow amount of gas flowing into the storage container from each of the purge units can be measured by transporting the measurement container on each of the purge tables in order with using the transport unit. Thereby, it becomes unnecessary to arrange the flow amount measurement unit in each of the purge units. Therefore, the cost can be reduced, and the space can be saved.

According to another aspect of the present invention, there is provided a measurement container in a transport system of a container including: a storage container which stores a substrate, plural purge units each of which includes a purge table on which the storage container is placed and a gas inlet for making a gas flow into a space formed by the storage container; and a transport unit which transports the storage container and the measurement container, including: a gas passage which communicates with the gas inlet in a case of being placed on the purge table; and a flow amount measurement unit which measures a flow amount of gas flowing in from the gas inlet through the gas passage.

In accordance with the measurement container, it becomes possible to measure the flow amount of gas flowing into the storage container from each of the purge units by moving the measurement container onto the each of the purge tables in series. Thereby, it becomes unnecessary to provide the flow amount measurement unit into each of the purge units. Therefore, the cost can be reduced, and the space can be saved.

Preferably, the measurement container may further include a storage unit which stores the flow amount of gas measured by the flow amount measurement unit. By this configuration, since the flow amount of gas measured by the flow amount measurement unit is stored, the flow amount of gas can be grasped at a later date.

The measurement container may further include a transmission unit which transmits the flow amount of gas stored by the storage unit to an external apparatus. By this configuration, a user can grasp the flow amount of gas flowing into the storage container from the purge unit by the external apparatus.

In addition, the measurement container may further include: a display unit which displays the flow amount of gas measured by the flow amount measurement unit; an image converting unit which captures an image of flow amount display by the display unit and converts the image of the flow amount display into image data; and a transmission unit which transmits the image data converted by the image converting unit to an external apparatus. In accordance with this configuration, by displaying the image of the flow amount of gas inflowing from the purge unit based on the image data, the user can grasp the flow amount of gas flowing into the storage container out of the purge unit by the external apparatus even if the flow amount measurement unit does not include the storage unit of the flow amount of gas and the transmission unit of the flow amount data of the gas.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENTS

First Embodiment

Figure 1:
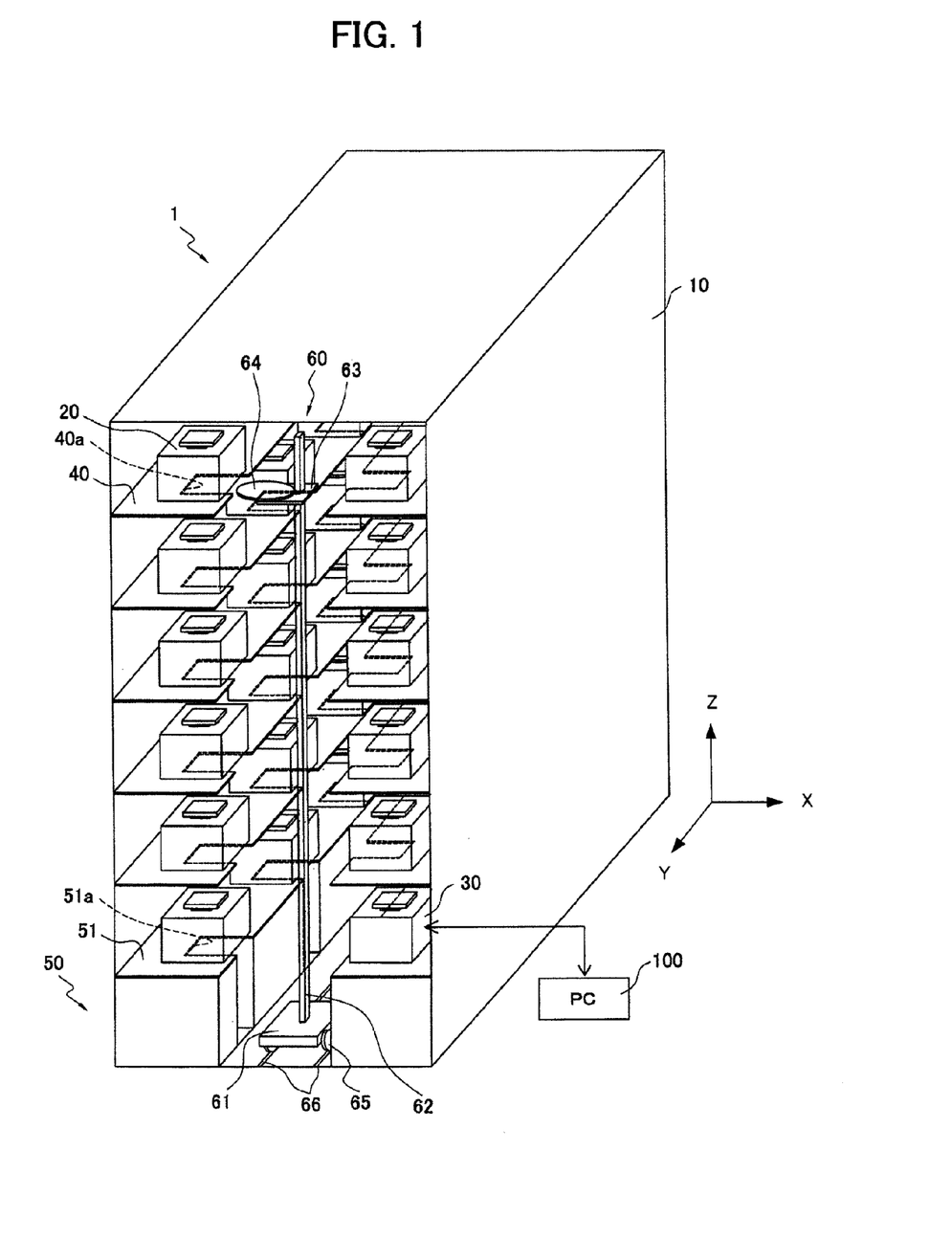
FIG. 1 is a schematic perspective view of a stocker according to a first embodiment.
Figure 2:
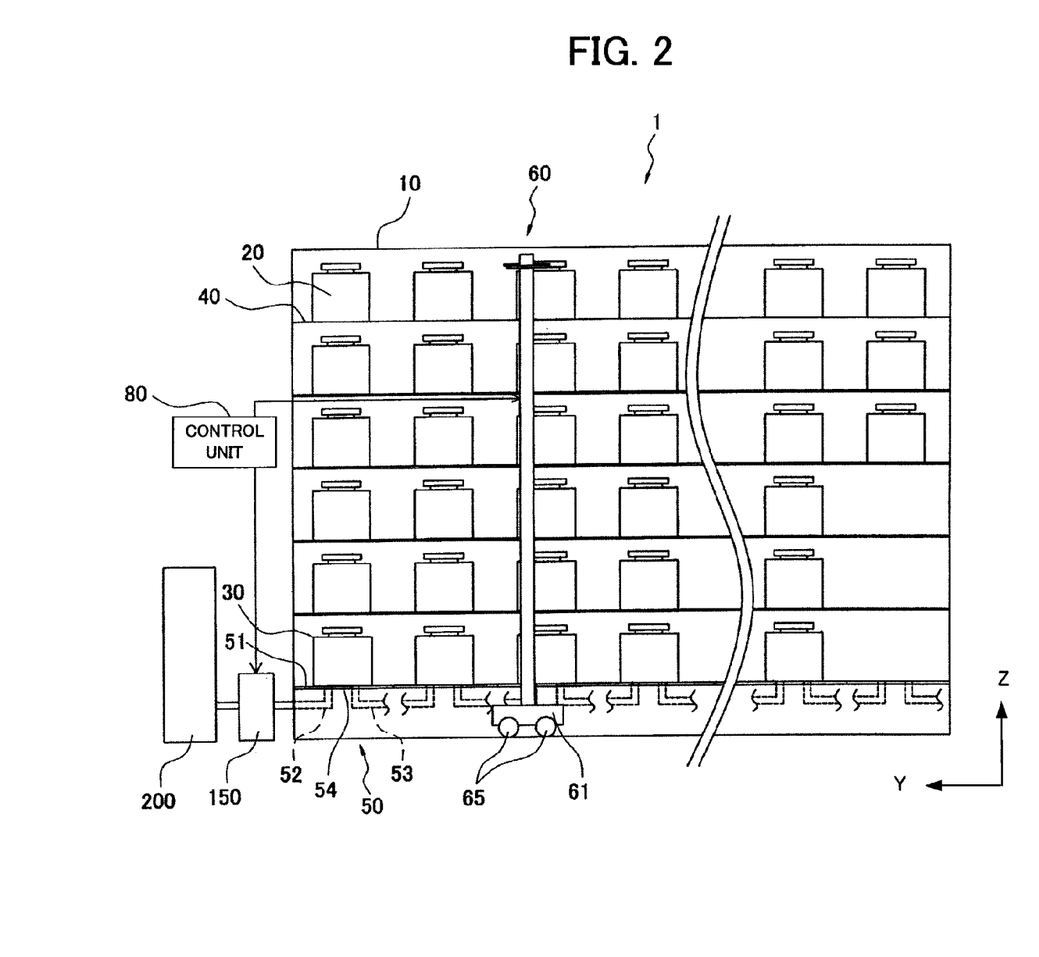
FIG. 2 is a schematic longitudinal cross-sectional view of the stocker according to the first embodiment.

A description will be given of a first embodiment of the present invention, with reference to the attached drawings. First, an explanation will be given to a stocker being a transport system of a container according to the first embodiment, with reference to FIG. 1 and FIG. 2. FIG. 1 is a schematic perspective view of the stocker according to the first embodiment. FIG. 2 is a schematic longitudinal cross-sectional view of the stocker according to the first embodiment.

As shown in FIG. 1 and FIG. 2, a stocker 1 includes a housing 10 having a storage shelf 40 with many steps, plural purge units 50 and a stacker crane (transport unit) 60. In addition, the stocker 1 includes a control unit 80, a personal computer 100, a flow amount controller 150 and a nitrogen gas supplying source 200.

The storage shelf 40 has five steps in a height direction Z. Recessed parts 40a are formed in a longitudinal direction Y (a left-right direction in FIG. 2) with an equal space in each of the storage shelves 40. On the upper parts of the respective recessed parts 40a, storage FOUPs (Front Open Unified Pods) (storage containers) 20 are placed in a line in the longitudinal direction Y.

The purge unit 50 includes a purge shelf 51 having plural purge tables 54, arranged in a line in the longitudinal direction Y, on which the plural storage FOUPs 20 subjected to purge are placed. Each of the purge units 50 includes a supplying piping 52 and an exhaust piping 53 at the lower part of the purge table 54.

The purge shelf 51 is obtained by arranging the plural purge tables 54 in the longitudinal direction Y, and is arranged below the storage shelves 40 arranged in a line in the height direction Z. The recessed parts 51a are formed in the longitudinal direction Y with equal spaces on the purge shelf 51, similarly to the storage shelf 40. Namely, the recessed part 51a is formed on each of the purge tables 54, and the storage FOUP 20 and the measurement FOUP (measurement container) 30 are placed on the upper parts of the recessed parts 51a.

One end of the supplying piping 52 communicates with the nitrogen gas supplying source 200 via the flow amount controller 150 for controlling the flow amount of nitrogen gas being the gas supplied to the storage FOUP 20. The other end thereof (gas inlet) projects on the upper surface side from the lower surface side of the purge table 54. Thereby, the flow amount of nitrogen gas supplied from the nitrogen gas supplying source 200 is controlled by the flow amount controller 150, and the nitrogen gas outflows from the upper surface of the purge table 54 via the supplying piping 52.

One end of the exhaust piping 53 projects on the upper surface side from the lower surface side of the purge table 54. The other end thereof communicates with an exhaust device (not shown) for exhausting the nitrogen gas. Thereby, the nitrogen gas flowing into the exhaust piping 53 front the upper surface of the purge table 54 is discharged by the exhaust device.

The stacker crane 60 includes a frame 61, a supporting pole 62, a supporting table 63 and a placing table 64.

The frame 61 includes four rotable traveling wheels 65 arranged on both of the left and right ends. The traveling wheels 65 rotably go and return on rails 66 provided on the bottom surface of the stocker 1. The supporting pole 62 extends from the upper surface of the frame 61 in the height direction Z. The supporting table 63 is slidable in the height direction Z with respect to the supporting pole 62, and is supported by the supporting pole 62. The placing table 64 is slidable on the supporting table 63 in the left-right direction (X direction) shown in FIG. 1, and is placed on the supporting table 63.

Now, a description will be given of an operation of the stacker crane 60. First, the stacker crane 60 moves on the rails 66 to a position opposite to the storage FOUP 20 to be transported. Then, the supporting table 63 slides in the height direction Z to the vicinity of the lower part of the storage FOUP 20 to be transported. Next, the placing table 64 slides towards the recessed part 40a at the lower part of the storage FOUP 20 to be transported. Then, the supporting table 63 upwardly slides. Thereby, the storage FOUP 20 to be transported is placed on the placing table 64.

When the storage FOUP 20 to be transported is placed on the placing table 64, the placing table 64 returns to the original position thereof. Next, the supporting table 63 slides and moves to the height of the storage shelf 40 to which the storage FOUP 20 is transported. Then, the stacker crane 60 moves on the rails 66 with using the traveling wheels 65, and the storage FOUP 20 moves to the position of the storage shelf 40 being the transport place. The placing table 64 slides to the recessed part 40a of the storage shelf 40 being the transport place, and the supporting table 63 slides downward. Thereby, the storage FOUP 20 is placed on the position of the storage shelf 40 being the transport place.

The control unit 80 controls the stacker crane 60 and the flow amount controller 150. The control unit 80 controls the stacker crane 60, and transports the storage FOUP 20 requiring the nitrogen gas purge to the purge table 54 from the storage shelf 40. When the storage FOUP 20 is placed on the purge table 54, the control unit 80 controls the flow amount controller 150 to supply the nitrogen gas of the desired flow amount to the storage FOUP 20. When the nitrogen gas purge to the storage FOUP 20 ends, the control unit 80 controls the stacker crane 60 to return the storage FOUP 20 to the storage shelf 40. The control unit 80 executes the same operation to each of the storage FOUPs 20.

In addition, the control unit 80 not only transports the storage FOUP 20 but also transports the measurement FOUP 30 between the purge shelves 54 with using the stacker crane 60. Then, the control unit 80 makes a flow meter 70, which will be described below, measure the flow amount of nitrogen gas supplied from each of the purge units 50.

When receiving the flow amount data of the nitrogen gas measured by the flow meter 70 via wireless communication, the personal computer 100 displays the flow amount data on the display thereof.

Figure 3:
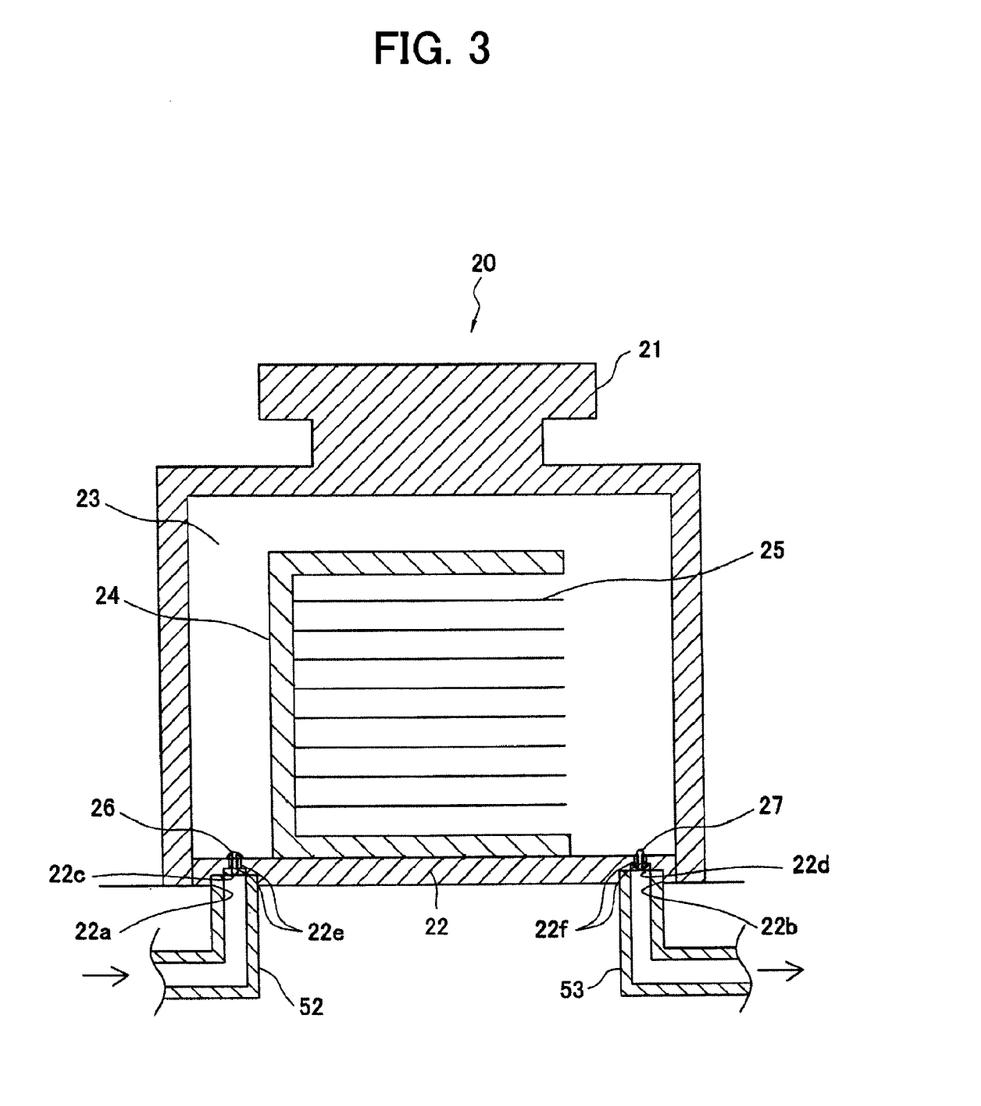
FIG. 3 is a longitudinal cross-sectional view of a storage FOUP.

Next, a description will be given of the storage FOUP 20 with reference to FIG. 3. FIG. 3 is a longitudinal cross-sectional view of the storage FOUP.

The storage FOUP 20 includes a cover 21 and a bottom surface part 22 forming the housing, and the cover 21 and the bottom surface part 22 forms a sealed space 23. A cassette 24 is provided in the sealed space 23, and stores plural semiconductor wafers 25 in the height direction.

On the lower surface of the bottom surface part 22, recessed parts 22a and 22b are formed in the vicinities of both the left and right ends. The recessed part 22a engages with the supplying piping 52 of the purge unit 50, and the recessed part 22b engages with the exhaust piping 53 of the purge unit 50. Recessed parts 22c and 22d having the same diameters as the inner diameters of the supplying piping 52 and the exhaust piping 53 are formed on the upper surfaces of the recessed parts 22a and 22h. Plural openings 22e and 22f for making the sealed space 23 and the outside communicate with each other are formed on the upper surfaces of the recessed parts 22c and 22d. On the bottom surface part 22, there are arranged two check valves, i.e., a check valve 26 which covers the opening 22e from the upper surface and which makes the gas flow only into the sealed space 23 from the outside and a check valve 27 which covers the opening 22f from the lower surface and which makes the gas flow only to the outside from the sealed space 23.

Only when the atmospheric pressure of the sealed space 23 is lower than the external atmospheric pressure by the predetermined atmospheric pressure, the check valve 26 opens and allows the gas to flow into the sealed space 23 from the outside. Only when the external atmospheric pressure is lower than the atmospheric pressure of the sealed space 23 by the predetermined atmospheric pressure, the check valve 27 opens and allows the gas to flow out of the sealed space 23. By placing the storage FOUP 20 on the purge table 54, the recessed part 22a and the supplying piping 52 engage with each other, and the recessed part 22b and the exhaust piping 53 engage with each other. When the nitrogen gas is supplied from the nitrogen gas supplying source 200 with the atmospheric pressure equal to or larger than the predetermined atmospheric pressure in this state, the check valve 26 opens by the pressure of the nitrogen gas supplied via the supplying piping 52, and the nitrogen gas is supplied to the sealed space 23. When the sealed space 23 is filled with the nitrogen gas and the internal pressure becomes equal to or larger than the predetermined atmospheric pressure, the check valve 27 opens, and the nitrogen gas is discharged by the exhaust device via the exhaust piping 53. In such a manner, by filling the sealed space 23 with the nitrogen gas, the growth of an oxide film due to natural oxidation of a semiconductor wafer 25 is prevented.

Figure 4:
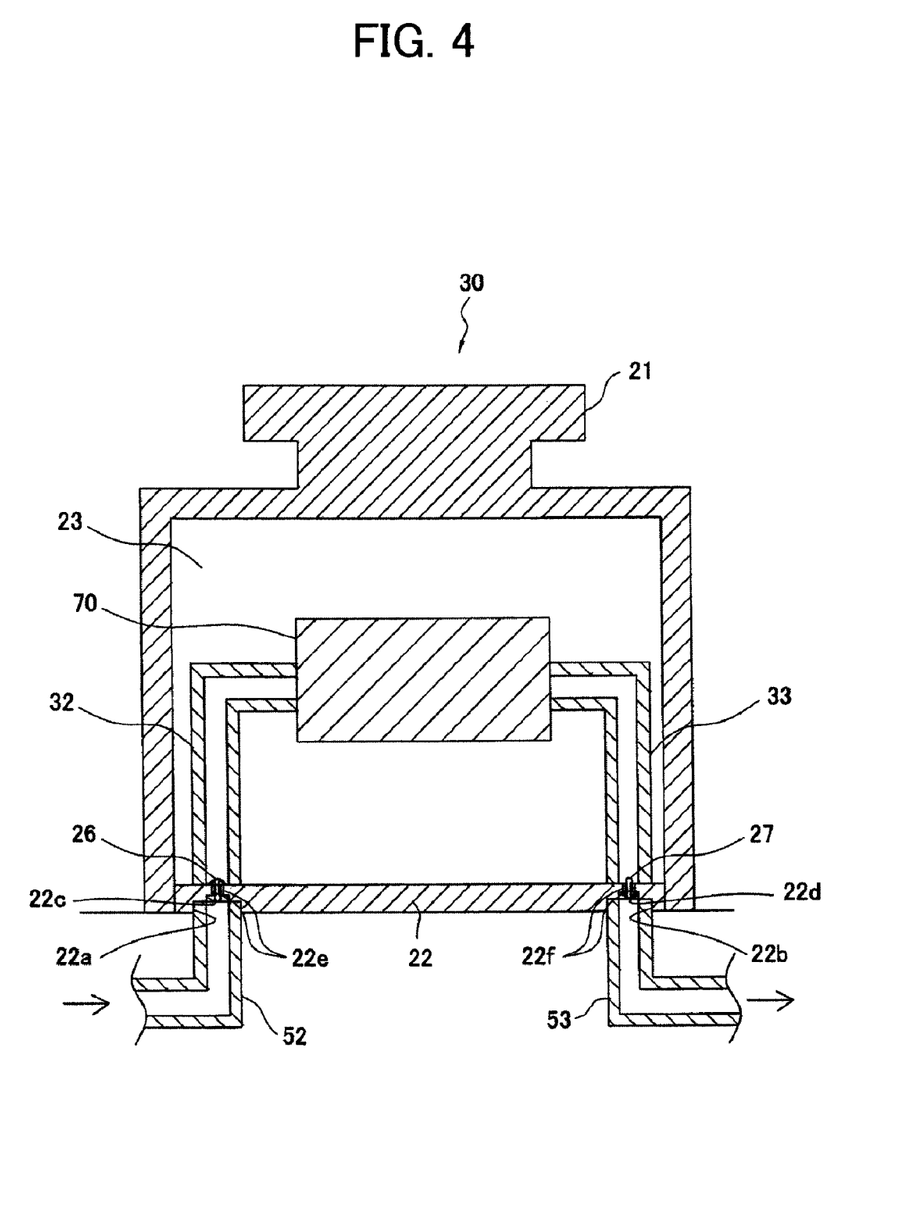
FIG. 4 is a longitudinal cross-sectional view of a measurement FOUP according to the first embodiment.

Next, a description will be given of the measurement FOUP 30 with reference to FIG. 4. FIG. 4 is a longitudinal cross-sectional view of the measurement FOUP according to the first embodiment.

Similarly to the storage FOUP 20, the measurement FOUP 30 includes the cover 21 and the bottom surface part 22, which form the sealed space 23. The flow meter (flow amount measurement unit) 70 is arranged in the sealed space 23.

The flow meter 70 includes an inlet (not shown) and an outlet (not shown). By making the gas flow in from the inlet and the gas flow out from the outlet, the flow meter 70 measures the flow amount of gas. The inlet communicates with one end of a piping 32 (gas passage). The other end of the piping 32 communicates with the upper surface of the bottom surface part 22 to cover the check valve 26 from the upper surface. The outlet communicates with one end of the piping 33. The other end of the piping 33 communicates with the upper surface of the bottom surface part 22 to cover the check valve 27 from the upper surface. Therefore, when the measurement FOUP 30 is placed on the purge table 54 and the nitrogen gas is supplied from the nitrogen gas supplying source 200 with the pressure equal to or larger than the predetermined pressure, the check valve 26 opens by the pressure of the nitrogen gas supplied via the supplying piping 52, and the nitrogen gas flows into the inlet of the flow meter 70 via the piping 32. When the pressure of the nitrogen gas flowing out to the piping 33 from the outlet of the flow meter 70 becomes equal to or larger than the predetermined pressure, the check valve 27 opens, and the nitrogen gas is discharged to the exhaust device via the exhaust piping 53. Thereby, it becomes possible to measure the flow amount of nitrogen gas supplied from the nitrogen gas supplying source 200.

Figure 5:
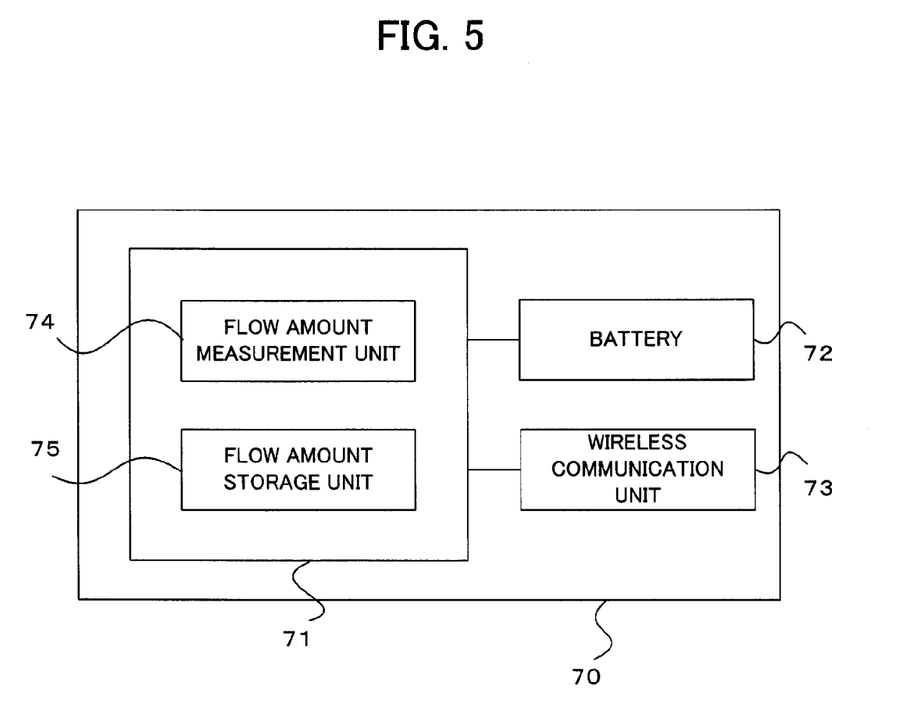
FIG. 5 is a block diagram showing an electric configuration of a flow meter according to the first embodiment.

Now, a description will be given of an electric configuration of the flow meter 70 with reference to FIG. 5. FIG. 5 is a block diagram showing the electric configuration of the flow meter according to the first embodiment.

The flow meter 70 includes a control unit 71, a battery 72 and a wireless communication unit (transmission unit) 73. The control unit 71 includes a hard disc in which program and data for controlling various kinds of operations are stored, a CPU which executes various kinds of calculations for generating signals for controlling the various kinds of operations, and RAM which temporarily stores data such as a calculation result in the CPU.

The control unit 71 includes a flow amount measurement unit 74 and the flow amount storage unit (storage unit) 75. The flow amount measurement unit 74 measures the flow amount of gas flowing in from the inlet. The flow amount storage unit 75 stores the flow amount of gas measured by the flow amount measurement unit 74.

The battery 72 activates the control unit 71 and the wireless communication unit 73. The wireless communication unit 73 transmits, to the personal computer 100, the flow amount of gas stored in the flow amount storage unit 75 by wireless communication.

Next, a description will be given of use application of the measurement FOUP 30 in the stocker 1. The sealed space 23 of each of the plural storage FOUPs 20 placed on the storage shelf 40 is filled with the nitrogen gas. However, the concentration of the nitrogen gas decreases with time, and moisture and ammonium gas are mixed into the sealed space 23. Thereby, the surface of the semiconductor wafer 25 in the storage FOUP 20 is oxidized, and molecular contamination occurs. In order to prevent these inconveniences, it becomes necessary to execute the nitrogen gas purge in the storage FOUP 20 and remove the moisture and the ammonium gas to fill the nitrogen gas in the storage FOUP 20, every predetermined time. Therefore, the storage FOUP 20 is transmitted to the purge unit 50 by the stacker crane 60 in order, and the nitrogen gas surge is executed in the storage FOUP 20.

At this time, since the plural storage FOUPs 20 are placed in the stocker 1, it is difficult that the single purge unit 50 executes the nitrogen gas purge in all the storage FOUPs 20 in order. Thus, the plural purge units 50 are provided in the stocker 1. The supplying flow amount of nitrogen gas by each of the purge units 50 is controlled by the flow amount controller 150, respectively. However, there may exist the purge unit 50 incapable of supplying the desired flow amount of nitrogen gas due to the malfunction of the flow amount controller 150 and clogging of the supplying piping 52. In this case, since it is supposed that the storage FOUP 20 incapable of sufficiently executing the nitrogen gas purge exists, it becomes necessary to measure the flow amount of nitrogen gas supplied from the purge unit 50 by the measurement FOUP 30. Thus, the measurement FOUP 30 is transported to the purge unit 50 by the stacker crane 60, and the flow amount of nitrogen gas supplied from the purge unit 50 is measured in order. Then, the flow amount of nitrogen gas measured in each of the purge units 50 is transmitted to the personal computer 100 outside the clean room. Thereby, the flow amount of nitrogen gas supplied from each of the purge units 50 is informed to the user.

By the stocker 1 and the measurement FOUP 30, by occasionally transporting the measurement FOUP 30 to each of the purge tables 54 with using the stacker crane 60, the flow amount of nitrogen gas supplied from each of the purge units 50 can be measured. Thereby, it becomes unnecessary that the flow meter 70 is provided in each of the purge units 50, and the cost can be reduced. In addition, the space can be saved.

Moreover, since the measurement FOUP 30 includes the wireless communication unit 73 for transmitting the flow amount of nitrogen gas stored in the flow amount storage unit 75 to the personal computer 100, the user can grasp the flow amount of nitrogen gas supplied from purge unit 50 by the personal computer 100.

Second Embodiment

Figure 6:
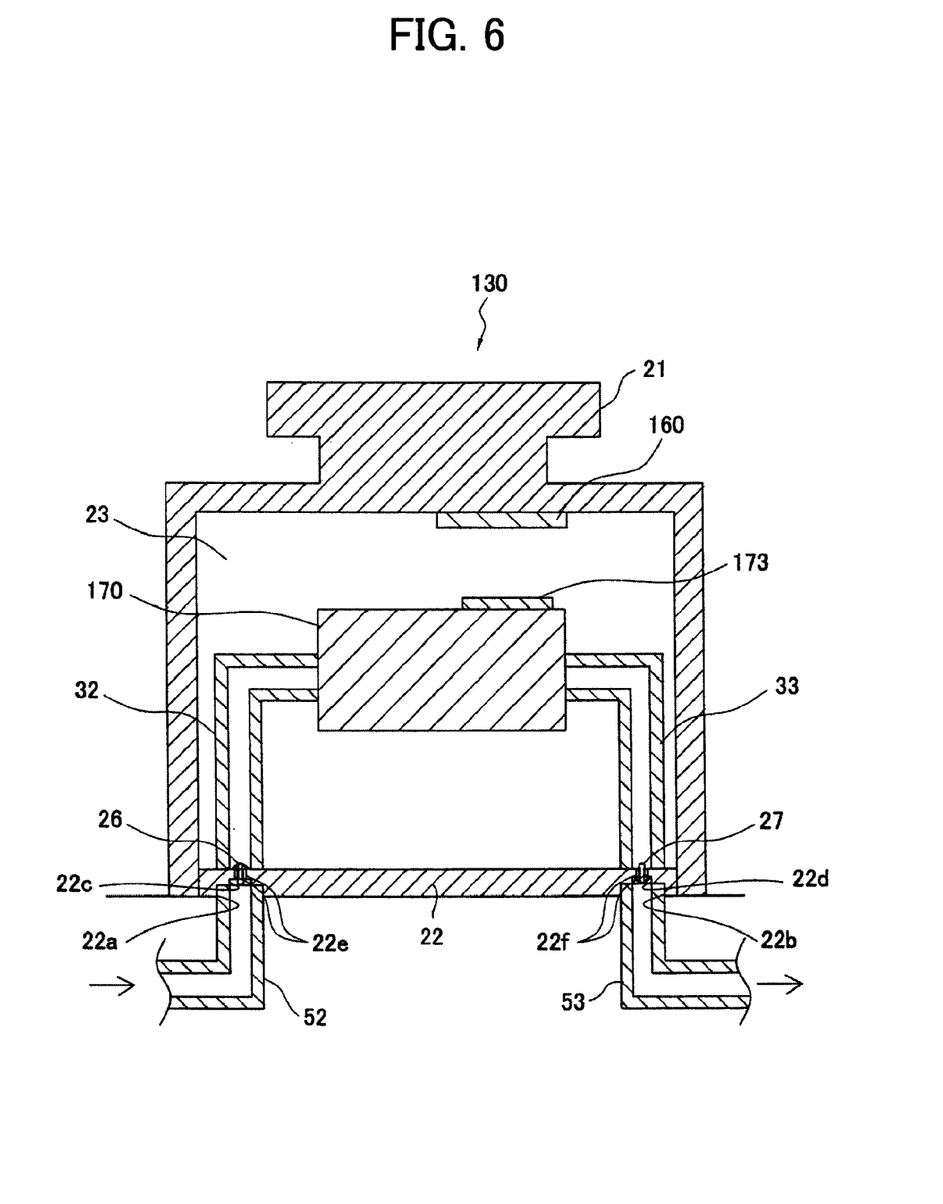
FIG. 6 is a longitudinal cross-sectional view of a measurement FOUP according to a second embodiment.
Figure 7:
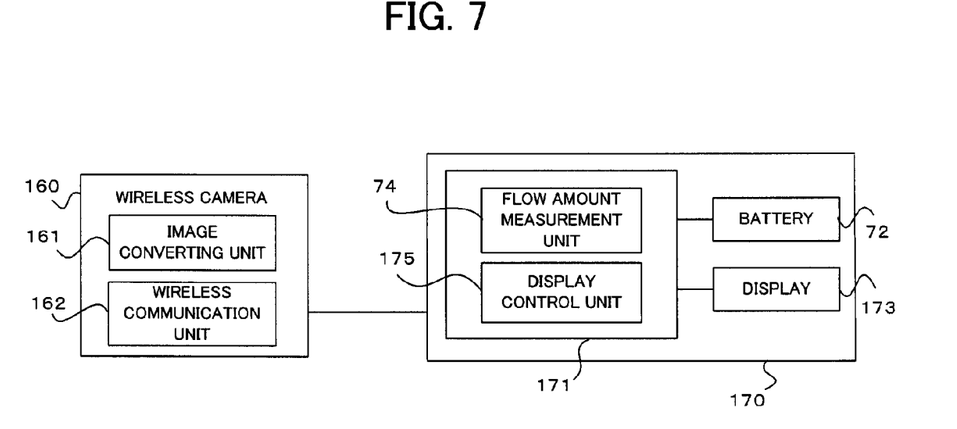
FIG. 7 is a block diagram showing an electric configuration of a flow meter according to the second embodiment.

Next, a description will be given of a second embodiment of the present invention, with reference to FIG. 6 and FIG. 7. FIG. 6 is a longitudinal cross-sectional view of the measurement FOUP according to the second embodiment. FIG. 7 is a block diagram showing an electric configuration of the flow meter according to the second embodiment. The same reference numerals are given to the actually same operations as those of the first embodiment, and explanations thereof are omitted.

Similarly to the storage FOUP 20, a measurement FOUP 130 includes the cover 21 and the bottom surface part 22, which form the sealed space 23. A wireless camera 160 and a flow meter (flow amount measurement unit) 170 are arranged in the sealed space 23.

The wireless camera 160 is arranged on the upper surface of the cover 21 in the sealed space 23, and captures the image of the flow amount of nitrogen gas displayed on a display 173 of the flow meter 170, which will be described later, to transmit the picture of the flow amount to the personal computer 100.

The flow meter 170 includes the display (display unit) 173 on the upper surface shown in FIG. 6, and displays, onto the display 173, the flow amount of nitrogen gas inflowing from the inlet. The other configuration is same as that of the flow meter 70.

A description will be given of the electric configurations of the wireless camera 160 and the flow meter 170. As shown in FIG. 7, the wireless camera 160 includes an image converting unit 161 and a wireless communication unit (transmission unit) 162. The image converting unit 161 captures the image of the flow amount of nitrogen gas displayed on the display 173, and converts the image into digital image data. The wireless communication unit 162 transmits, to the personal computer 100, the digital image data converted by the image converting unit 161 via the wireless communication.

The flow meter 170 includes a control unit 171, the battery 72 and a display (transmission unit) 173. The control unit 171 includes a hard disc in which program and data for controlling various kinds of operations are stored, a CPU which executes various kinds of calculations for generating signals for controlling the various kinds of operations and a RAM which temporarily stores data such as a calculation result in the CPU.

The control unit 171 includes the flow amount measurement unit 74 and a display control unit 175. The flow amount measurement unit 74 measures the flow amount of gas flowing in from the inlet. The display control unit 175 displays the flow amount of nitrogen gas measured by the flow amount measurement unit 74 on the display 173.

In this manner, the measurement FOUP 130 includes the display 173 for displaying the flow amount of nitrogen gas measured by the flow meter 170, the image converting unit 161 for capturing the image of the display of the flow amount by the display 173 and converting the image of the display into the image data, and the wireless communication unit 162 for transmitting the image data converted by the image converting unit 161 to the personal computer 100. Thereby, the image of the flow amount of nitrogen gas flowing in from the purge unit 50 can be displayed based on the image data. Thus, even if the flow meter 170 does not include the storage unit of the flow amount of nitrogen gas and the transmission unit of the flow amount data of the nitrogen gas, the user can grasp the flow amount of nitrogen gas flowing into the storage FOUP 20 from the purge unit 50 with using the personal computer 100. In addition, by displaying the image of the flow amount of nitrogen gas flowing in from the purge unit 50 based on the image data, the user can visually grasp the flow amount of nitrogen gas.

The description was given of the preferred embodiments of the present invention, but the present invention is not limited to the above embodiments. Namely, variation is possible within the range of Claims. For example, in the above embodiment, the flow meter 70 transmits, to the personal computer 100, the flow amount of nitrogen gas stored in the flow amount storage unit 75 by the wireless communication unit 73. However, the user may make the personal computer read the flow amount of nitrogen gas from the flow amount storage unit 75 by directly removing the flow meter 70 to grasp the flow amount, without the wireless communication unit 73.

In the manner of the above embodiments, the nitrogen gas is used as the gas for executing the purge in the sealed space 23 of the storage FOUP 20. However, the gas is not limited to the nitrogen gas. Namely, any gas capable of preventing the oxidation and the molecular contamination and capable of removing the moisture, such as CDA (clean dry air), can be used.

Moreover, though the stocker 1 is explained as an example in the manner of the above embodiments, the application of the present invention is not limited to this. Even if the storage shelf 40 is not arranged unlike the stocker 1, only the plural purge units 50 may be placed in the clean room. Namely, by placing the purge unit 50 not in the device for storing the storage FOUP 20 but in the transport passage between the manufacturing processes of the semiconductor wafer, the nitrogen gas purge may be executed in the storage FOUP 20 in the transport process.

In the manner of the above embodiments, the storage FOUP 20 includes the opening 22c into which the nitrogen gas flows in and the opening 22d from which the nitrogen gas flows out. However, in such a case that the nitrogen gas is supplied only for removing the moisture or for preventing the decrease of the pressure in the storage FOUP 20, it is possible that the opening 22d from which the nitrogen gas flows out is not included.

In addition, in the manner of the above embodiments, the semiconductor wafer 25 is stored in the storage FOUP 20. However, the present invention is not limited to the semiconductor wafer 25. Namely, anything such as a disc substrate, a liquid crystal substrate and an electronic substrate may be stored in the storage FOUP 20.

Moreover, in the manner of the above embodiments, the storage FOUP 20 is used in order to store the semiconductor wafer 25. However, not the storage FOUP 20 but a reticule pod and an SMIF pod (Standard Manufacturing Interface pod) may be used.

Furthermore, in the manner of the above embodiments, the flow amount controller 15 is included in order to control the flow amount of nitrogen gas. However, the present invention is not limited to the flow amount controller 150. Namely, the flow amount of nitrogen gas may be also controlled by a needle valve.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2006-345409 filed on Dec. 22, 2006 including the specification, claims, drawings and summary is incorporated herein by reference in its entirety.

What is claimed is:

1. A stocker for storing a plurality of storage containers, each of the storage containers including a first housing defining a first space for storing a substrate, and an opening in the first housing through which a gas flows into the first space, the stocker comprising:
    plural shelves on which the storage containers are placed;
    plural purge units arranged in a longitudinal direction of the stocker and on a part of the plural shelves, each of the plural purge units including a purge table adapted to receive one of the storage containers and a gas inlet communicating with the opening and through which the gas flows to the first space when the storage container is on the purge table;
    a measurement container that includes a second housing defining a second space, a gas passage in the second housing communicating with the gas inlet and through which the gas flows into the second space when the measurement container is on the purge table, and a flow amount measurement unit in the second space that measures an amount of the gas flowing from the gas inlet through the gas passage; and
    a transport unit that transports the storage container to the purge table and that transports the measurement container among plural ones of the purge table,
    wherein a portion of the first housing received on the purge table is substantially a same size as that of the second housing, and
    wherein an exterior of the first housing has substantially a same shape and size as an exterior of the second housing.

2. The stocker according to claim 1, wherein the measurement container further comprises a storage unit that stores gas flow data measured by the flow amount measurement unit.

3. The stocker according to claim 2, wherein the measurement container further comprises a transmission unit that transmits the gas flow data stored by the storage unit to an external apparatus.

4. The stocker according to claim 1, wherein the measurement container further comprises:
    a display unit which displays gas flow data measured by the flow amount measurement unit;
    an image converting unit which captures an image displayed by the display unit and converts the image into image data; and
    a transmission unit which transmits the image data converted by the image converting unit to an external apparatus.

5. The stocker according to claim 1, wherein the plural purge units include at least one purge unit that does not have said flow amount measurement unit.

6. A measurement container for a stocker that stores a plurality of storage containers that store substrates, the stocker including a purge unit with a purge table adapted to receive one of the storage containers and the measurement container, a gas inlet through which gas flows to the storage container when on the purge table, and a transport that moves the storage containers and the measurement container, the measurement container comprising:
    a gas passage communicating with the gas inlet and through which the gas flows to inside the measurement container when the measurement container is on the purge table; and
    a flow amount measurement unit inside the measurement container that measures an amount of the gas flowing from the gas inlet through the gas passage;
    wherein an exterior of the measurement container has substantially a same shape and size as an exterior of the storage containers.

7. The measurement container according to claim 6, further comprising a storage unit that stores gas flow data measured by the flow amount measurement unit.

8. The measurement container according to claim 7, further comprising a transmission unit that transmits the gas flow data stored by the storage unit to an external apparatus.

9. The measurement container according to claim 6, further comprising:
    a display unit which displays gas flow data measured by the flow amount measurement unit;
    an image converting unit which captures an image displayed by the display unit and converts the image into image data; and
    a transmission unit which transmits the image data converted by the image converting unit to an external apparatus.

10. A stocking system comprising:
    a storage container including a first housing defining a first space for storing a substrate, and a first opening in the first housing through which a gas flows into the first space;

a measurement container that includes a second housing defining a second space, a second opening in the second housing through which the gas flows into the second space, and a gas flow measurement unit in the second space that measures an amount of the gas flowing into the second space;

plural shelves on which the storage containers are placed;

a purge table on a part of the plural shelves and adapted to alternatively receive the storage container and the measurement container, the purge table having a gas inlet communicating with the first opening when the storage container is on the purge table so that the gas flows into the first space and communicating with the second opening when the measurement container is on the purge table so that the gas flows into the second space; and a transport unit that alternatively transports the storage container and the measurement container to the purge table, wherein a portion of the first housing received on the purge table is substantially a same size as that of the second housing, and wherein an exterior of the first housing is substantially a same shape and size as an exterior of the second housing.

11. The stocking system according to claim 10, wherein the purge table does not have said flow amount measurement unit.

* * * * *